(12) United States Patent
Snyder

(10) Patent No.: US 10,443,499 B2
(45) Date of Patent: Oct. 15, 2019

(54) ENHANCED HEAT SINK AVAILABILITY ON GAS TURBINE ENGINES THROUGH THE USE OF COOLERS

(71) Applicant: Rolls-Royce North American Technologies, Inc., Indianapolis, IN (US)

(72) Inventor: Douglas J. Snyder, Carmel, IN (US)

(73) Assignee: Rolls Royce North American Technologies, Inc., Indianapolis, IN (US)

( * ) Notice: Subject to any disclaimer, the term of this patent is extended or adjusted under 35 U.S.C. 154(b) by 392 days.

(21) Appl. No.: 14/706,062

(22) Filed: May 7, 2015

(65) Prior Publication Data

US 2016/0215696 A1 Jul. 28, 2016

Related U.S. Application Data

(60) Provisional application No. 61/990,223, filed on May 8, 2014.

(51) Int. Cl.
| | | |
|---|---|---|
| *F02C 7/12* | (2006.01) | |
| *F02C 7/14* | (2006.01) | |
| *F02C 7/16* | (2006.01) | |
| *H05K 7/20* | (2006.01) | |
| *F01D 25/12* | (2006.01) | |

(Continued)

(52) U.S. Cl.
CPC ............ *F02C 7/16* (2013.01); *F01D 25/12* (2013.01); *F02C 7/12* (2013.01); *F02C 7/14* (2013.01); *F02C 7/224* (2013.01); *F02K 3/115* (2013.01); *H01L 35/30* (2013.01);

(Continued)

(58) Field of Classification Search
CPC .... F02C 7/12; F02C 7/16; F02C 7/224; F02C 7/14; F02C 7/18; F01D 25/12; F05D 2260/20; F05D 2260/213; F05D 2220/76; H01L 35/00; H01L 35/28; H01L 35/30; H05K 7/2039; H05K 7/20445; H05K 7/20163; F02K 3/105; F02K 3/115; F02K 1/822

See application file for complete search history.

(56) References Cited

U.S. PATENT DOCUMENTS 4,608,819 A * 9/1986 Colman .................. F01D 17/02
361/690
5,584,183 A * 12/1996 Wright .................... F25B 21/02
165/58

(Continued)

FOREIGN PATENT DOCUMENTS

| EP | 1905986 A2 | 4/2008 |
|---|---|---|
| EP | 2581554 A2 | 4/2013 |

(Continued)

OTHER PUBLICATIONS

EP Search Report for EP-15166469.5, dated Sep. 24, 2015, 3 pp.
EP Office Action for EP-15166469.5, dated Jul. 19, 2019.

*Primary Examiner* — Alain Chau
(74) *Attorney, Agent, or Firm* — Fishman Stewart PLLC

(57) ABSTRACT

A cooling assembly for a gas turbine engine including a heat source at a first temperature, a heat sink at a second temperature, and a heat pump coupled to the first heat source and the first heat sink. The heat pump is configured to convey a quantity of heat from the heat source through the heat pump and to the heat sink.

12 Claims, 4 Drawing Sheets

(51) Int. Cl.
*F02C 7/224* (2006.01)
*F02K 3/115* (2006.01)
*H01L 35/30* (2006.01)

(52) U.S. Cl.
CPC ... H05K 7/20163 (2013.01); *F05D 2260/213* (2013.01); *Y02T 50/676* (2013.01)

(56) References Cited

U.S. PATENT DOCUMENTS

| | | | |
|---|---|---|---|
| 6,481,211 B1 | 11/2002 | Haas | |
| 7,231,180 B2 | 6/2007 | Benson et al. | |
| 7,368,827 B2 | 5/2008 | Kulkarni et al. | |
| 7,779,811 B1* | 8/2010 | Mailander | H05K 7/20445 123/399 |
| 8,127,555 B2* | 3/2012 | Jarmon | B64C 1/38 60/267 |
| 8,313,056 B2* | 11/2012 | Jarmon | F01D 15/10 244/58 |
| 8,424,285 B2* | 4/2013 | Veilleux, Jr. | F01D 25/12 60/39.83 |
| 8,962,968 B2* | 2/2015 | Brillet | B64D 41/00 136/200 |
| 9,018,512 B2* | 4/2015 | Kwok | F02C 6/18 136/205 |
| 2005/0022855 A1* | 2/2005 | Raver | F02C 6/18 136/205 |
| 2007/0018038 A1* | 1/2007 | Jarmon | F01D 15/10 244/59 |
| 2008/0017237 A1* | 1/2008 | Bray | H01L 35/26 136/224 |
| 2009/0151321 A1* | 6/2009 | Jarmon | B64C 1/38 60/266 |
| 2010/0011781 A1* | 1/2010 | Lents | B64D 13/00 62/3.7 |
| 2011/0120075 A1* | 5/2011 | Diaz | B64D 29/00 60/39.11 |
| 2011/0283712 A1* | 11/2011 | Brillet | B64D 41/00 60/801 |
| 2012/0118345 A1* | 5/2012 | Stoia | F01D 5/284 136/205 |
| 2013/0074520 A1* | 3/2013 | Wyatt | F25B 21/02 62/3.2 |
| 2013/0160461 A1* | 6/2013 | Broughton | F02C 7/12 60/796 |
| 2013/0213054 A1* | 8/2013 | Ganti | F02C 7/224 60/782 |
| 2013/0219872 A1* | 8/2013 | Gibble | F01K 15/02 60/320 |
| 2013/0255220 A1* | 10/2013 | Mathews, Jr. | F02C 9/00 60/39.24 |
| 2013/0305728 A1* | 11/2013 | P.S. | F02C 9/26 60/772 |
| 2013/0319016 A1 | 12/2013 | Fontanel et al. | |
| 2015/0082804 A1* | 3/2015 | Charrier | F02K 3/115 60/785 |

FOREIGN PATENT DOCUMENTS

EP 2631452 A2 8/2013
WO WO 2013160602 A1 * 10/2013 ............. F02K 3/115

* cited by examiner

ENHANCED HEAT SINK AVAILABILITY ON GAS TURBINE ENGINES THROUGH THE USE OF COOLERS

CROSS-REFERENCE TO RELATED APPLICATIONS

This application claims priority to U.S. Provisional Patent Application No. 61/990,223 filed May 8, 2014, the contents of which are hereby incorporated in their entirety.

GOVERNMENT RIGHTS

This disclosure was made with government support under FA-8650-07-C-2803 awarded by the United States Air Force. The government has certain rights in the disclosure.

FIELD OF TECHNOLOGY

An improved heat management system for use in a gas turbine engine is disclosed.

BACKGROUND

Heat transfer or cooling schemes often include one or more heat sources that need to be cooled. Heat sources may include components such as electronic components or materials such as lubrication oils. Generally, heat from these one or more sources is transported to one or more heat sinks so that the source(s) may be cooled. In the gas turbine sector, a common heat sink employed is the gas turbine fuel. That is, heat from heat sources are often transferred into the gas turbine fuel. However, with conventional cooling schemes, thermodynamic properties often create limitations on the cooling schemes. For example, when conventional cooling practices are followed, to transfer heat from a source to a sink, the source is generally at a higher temperature than the sink. Furthermore, as heat load increases (i.e., that amount of heat being transferred), the temperature difference between the source and the sink generally increases.

To obtain these differences in temperatures between the fuel and heat sources so that the heat load demand can be met, restrictions or limitations are often put on the maximum fuel temperatures so that the fuel can be effectively used as a heat sink for components of the engine. In other words, a fuel temperature is set so that the temperature difference between the heat source and the heat sink (i.e., the fuel) is sufficient to reject the heat load. The manner in which this is often accomplished is by minimizing the heat load on the fuel. That is, the amount of heat sources that will use the fuel as a heat sink is minimized, or at least a limit is placed on how much heat these sources can convey to the fuel, so that the fuel temperature does not go over a predetermine temperature. As such, the fuel can still effectively cool important engine components. Often, this means minimizing the functionality of electrical systems so they do not over-utilize the fuel as a heat sink. Alternatively, mission capability may be limited to, for example, to maintain acceptably low fuel tank temperatures.

Accordingly, there is room for improvement in this area.

BRIEF DESCRIPTION OF THE DRAWINGS

While the claims are not limited to a specific illustration, an appreciation of the various aspects is best gained through a discussion of various examples thereof. Referring now to the drawings, exemplary illustrations are shown in detail. Although the drawings represent the illustrations, the drawings are not necessarily to scale and certain features may be exaggerated to better illustrate and explain an innovative aspect of an example. Further, the exemplary illustrations described herein are not intended to be exhaustive or otherwise limiting or restricted to the precise form and configuration shown in the drawings and disclosed in the following detailed description. Exemplary illustrations are described in detail by referring to the drawings as follows:

DETAILED DESCRIPTION

Figure 1A:
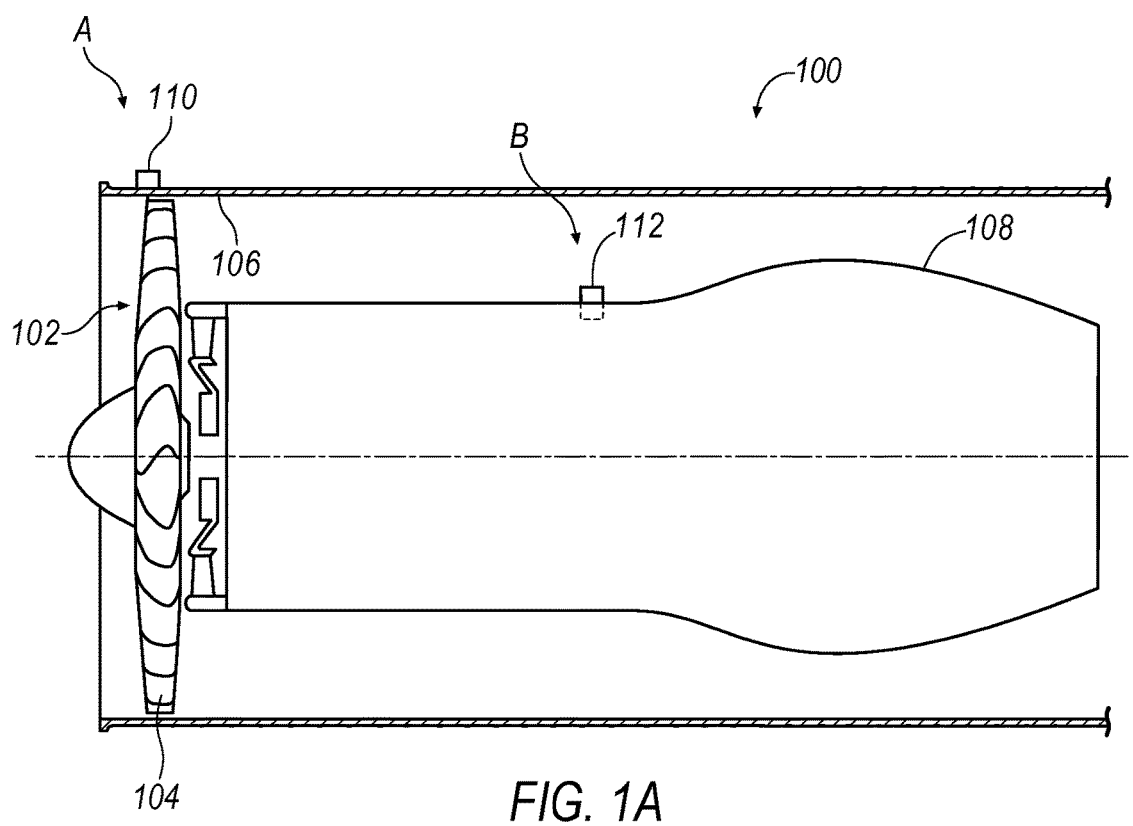
FIG. 1A illustrates an exemplary gas turbine engine with a cooling assembly and a power generation system.

FIG. 1A illustrates portions of an exemplary gas turbine engine 100 having cooling assemblies 110 and a power generation system 112. Portions of the gas turbine engine 100 include a fan 102 with a fan rotor 104, a fan case 106, and an inner fan casing 108. Refrigerator devices or cooling assemblies 110 are set forth in detail below (see FIGS. 1B-4) and they can be employed in a wide variety of locations in a gas turbine engine such as the gas turbine engine 100 of FIG. 1A.

Figure 1B:
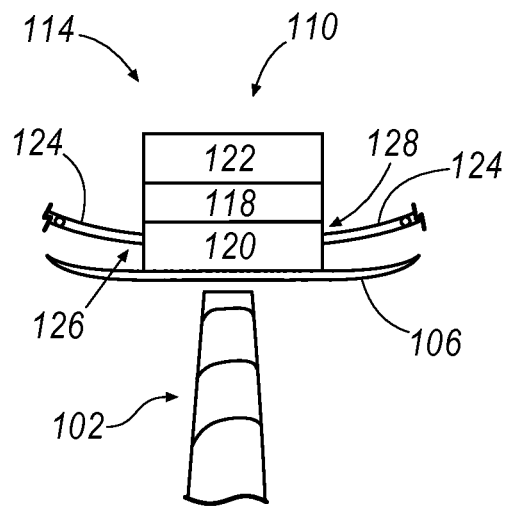
FIG. 1B illustrate an exemplary cooling assembly according to an embodiment.
Figure 1C:
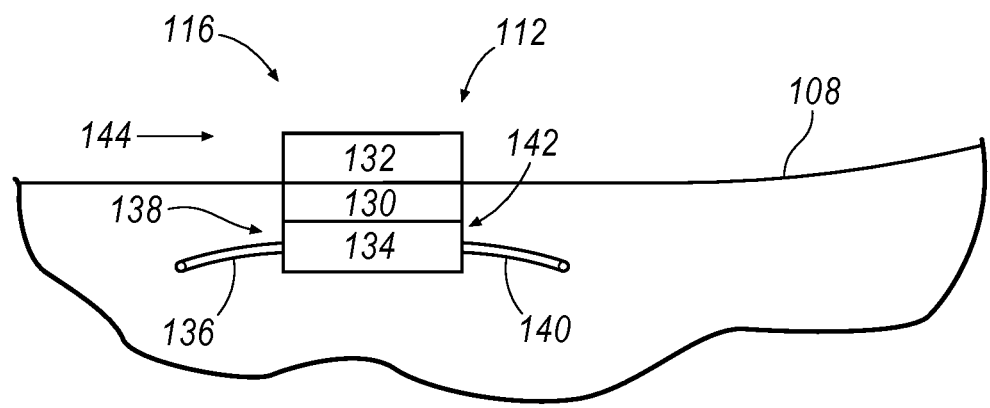
FIG. 1C illustrate an exemplary power generation system.

Exemplary positions of a first cooling assembly 110 at region A and a power generation device assembly 112 at region B are shown, where region A is on the fan case 106 and region B is on the engine inner fan casing 108, respectively. Referring to FIGS. 1A-1C, an exaggerated view of region A 114 is depicted in FIG. 1B and an exaggerated view of region B 116 is shown in FIG. 1C.

With reference now to FIG. 1B, a block diagram of the first cooling assembly 110 (i.e., a heat management system) on the fan case 106 or inner fan casing 108 is shown in the exaggerated view of region A 114. The first cooling assembly 110 includes a heat pump 118 and a cold plate 120.

The first cooling assembly 110 is coupled to a heat source 122 and the fan case 106 or inner fan casing 108. When the first cooling assembly 110 is energized, the heat pump 118 conveys heat from the heat source 122, through the heat pump 118, and to the heat removal component 120, thus cooling the heat source 122. It is noted that embodiments of this disclosure may employ various heat removal components. For example, thermal spreading devices, high conduction materials, heat pipes and/or vapor chambers, or cold plates with fluid. In addition, heat spreader devices could be used on the heat source 122 side of heat pump 118 to aid in the spreading of heat.

In a similar manner, the heat pump 118 may take on a variety of forms. For example, the heat pump 118 may be a thermoelectric cooler (TEC) or a thermionic chip. Each device is powered for operation. Further details with regard to energizing the first cooling assembly 110 will be set forth in detail below with respect to FIG. 3. Like the heat pump 118 of FIG. 1B, the heat removal component 120 can also take on a variety of forms. The heat removal component 120 may be a variety of shapes and be made of a variety of heat spreading and/or heat conducting materials such as aluminum or copper. Further, the heat removal component 120 may have voids (not shown) therein where a coolant can be passed through. For example, according to an embodiment depicted in FIG. 1b, the heat removal component 120 has a fuel line 124 passing therethrough. In such an embodiment, fuel (not shown) passing through the fuel line 124 passes through the heat removal component 120.

It is noted that the fuel line 124 need not pass through the heat removal component 120. Rather, the fuel line 124 may be coupled to the heat removal component 120 and/or on a first side 126 of the heat removal component 120 and also on a second side 128 of the heat removal component 120. Alternatively, the fuel could scrub the ends or portions of the heat removal component 120 or heat spreading device instead of passing therethrough. In either embodiment, the first cooling assembly 110 rejects heat to the fuel, thus cooling the heat pump 118.

According to an embodiment, the cooling assembly 110 is coupled to the fan case 106 by bolting the heat removal component 120 to the fan case 106 or inner fan casing 108. It is noted, however, that the first cooling assembly 110 need not be bolted to the fan case 106, as other techniques may be employed to couple the first cooling assembly 110 to the fan case 106 or inner fan casing 108 or located elsewhere in the engine/vehicle system With regard to the heat source 122, it is contemplated that the heat source 122 may be an electronic component such as a full authority digital engine controller (FADEC), which can benefit from cooling. A FADEC is a known system that includes a digital computer, called an electronic engine controller (EEC) or engine control unit (ECU), and its related accessories that control aspects of aircraft engine performance. FADECs have been produced for both piston engines and turbine based jet engines. It is noted, however, that other components beside electronic components can be employed as the heat source 122.

Referring now to FIG. 1C, a block diagram of a power generation system 112 having an inner fan casing 108 is shown in the exaggerated view of position B 116. The power generation system 112 includes a generator 130 (such as and possibly similar to a solid-state heat pump) and a surface cooler heat exchanger (HX) 132 coupled thereto, where the surface cooler HX 132 serves as a heat sink. According to the embodiment depicted in FIG. 1C, the generator 130 may be located within the inner fan casing 108 (FIG. 1A) and the cooler 130 may be positioned on an outer surface 134 of the inner fan casing 108. It contemplated that the inner fan case 108 serves as a mounting surface for the generator 130 and the surface cooler heat exchanger 132.

Coupled to the generator 130 is a heat source HX 134. An intake piping 136 is coupled onto a first side 138 of the heat source HX 134 and an outtake piping 140 is coupled to a second side 142 of the heat source HX 134.

When a temperature difference is applied across the generator 130 conveys or transfers heat from the heat source HX 134 to the surface cooler HX 132. From the surface cooler HX 132, the heat would be conveyed to a bypass air stream 144 passing over the inner fan casing 108 and through or past the surface cooler HX 132. In the process, an electric potential is generated in device 130.

Hot material (not shown) passing through the intake piping 136 and into the heat source HX 134 provides the heat source HX 134 with an ample supply of heat. Effectively, the heat source HX 134 serves as a heat or thermal reservoir. A variety of hot material may be used. For example, the hot material could be the engine's hot compressor air, hot oil, hot fuel, hot coolant, or other high temperature fluids or gases. It will be appreciated that the material exiting the heat source HX 134 via the outtake piping 140 will be cooler than the material entering the heat source HX 134 via the intake piping 136.

Figure 2:
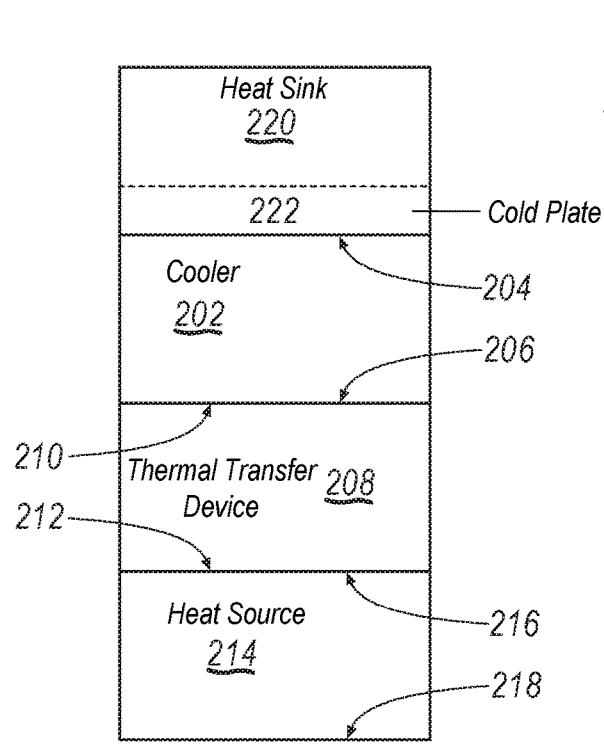
FIG. 2 illustrates a block diagram of an exemplary cooling system according to an embodiment.

With reference now to FIG. 2, a block diagram of an exemplary heat management system 200 for use in a gas turbine engine is shown according to an embodiment. The heat management system 200 includes a cooler 202, having a first side 204 and a second side 206, a thermal transfer device 208 having a first side 210 and a second side 212, a heat source 214 having a first side 216 and a second side 218, and a heat sink 220. It will be appreciated that the thermal transfer device 208 could be a solid plate or member. The member may include heat pipes, a vapor chamber, or a combination thereof.

According to embodiments, the cooler 202 can take on a variety of forms. For example, the cooler 202 may be a TEC, also known as a thermoelectric cooler. TECs rely on the Peltier effect. Such coolers are generally composed of an electrically conductive material. Heat flows from one junction to another junction in the TEC when charge carrier diffusion is initiated therein by an applied or induced direct current (DC).

Another exemplary cooler 202 is a thermionic cooling module or cooler. In part, a thermionic cooler differs in operation from a TEC in that a thermionic cooler employs ballistic electron transport to achieve cooling, whereas a TEC instead employs diffusion transport of electrons to achieve cooling. Each, however, relies on a current to drive their cooling operations.

According to an embodiment, the second side 206 of the cooler 202 is coupled with the first side 210 of the thermal transfer device 208. It is contemplated that the cooler 202 is in contact with the thermal transfer device 208 (i.e., a thermally conductive material).

While the cooler 202 is coupled to the first side 210 of the thermal transfer device 208, the second side 212 of the thermal transfer device 208 is coupled to the first side 216 of the heat source 214.

The heat source 214 can take on a variety of forms. For example, according to an embodiment the heat source is FADEC, which can benefit from cooling.

With reference to the present embodiment of FIG. 2, while the cooler 202 is coupled to the heat source 214 via the thermal transfer device 208, cooler 202 is also coupled to the heat sink 220 at the first side 204 of the cooler 202. The heat sink 220 may take on a variety of forms. For example, the heat sink 220 may be a fuel for a gas turbine engine or a ram air stream.

In operation, the cooler 202 is able to drive heat from a cooler material (i.e., the heat source 214) to a warmer material (i.e., the heat sink 220). As an example, consider a FADEC as the heat source 214 and gas turbine engine fuel as the heat sink 220. According to such an embodiment, the cooler 202, when energized, will draw heat from the heat source 214 (e.g., the FADEC) up through the thermal transfer device 208, up through the cooler 202 itself, and transfer it to the heat sink 220 (e.g., the fuel).

It is contemplated that an intermediary device may be employed to convey the heat from the cooler 202 to the heat sink 220. Accordingly, a cold plate 222 is shown in partial phantom as exemplary option. In such an embodiment, the cooler 202 is coupled to or in connection with the cold plate 222 while the cold plate 222 is coupled to or in connection with the heat sink 220. Accordingly, the cold plate 222 serves as an intermediary in the heat transfer from the cooler 202 to the heat sink 220. It will be appreciated that the cold plate 222 could be a heat pipe or vapor chamber with a liquid circulating within or extended fins with air flowing across its body (not shown).

Thus, in the examples illustrated, a benefit is that it is not necessary to maintain the heat sink 220 below the temperature of the heat source 214 in order for heat transfer to occur. That is, the cooler 202 enables heat transfer to occur in a direction that passes from heat source 214 to heat sink 220, even when heat source 214 is at a temperature that is below that of the heat sink 220. However, even in embodiments when the heat source 214 is at a higher temperature than the heat sink 220, the cooler 202 increases the given quantity of heat rejection (i.e., quantity of heat conveyed to the heat sink 220) per thermal difference between the two 214, 220. In other words, the heat management system 200 employing the cooler 202 can allow a greater heat load to be transferred to the heat sink 220 without necessarily having to increase the temperature difference between the heat sink 220 and heat source 214. An illustration of this concept will be set forth later with respect to FIG. 4.

According to embodiments, some components (i.e., heat sources) that were traditionally not able to use fuel, for example, as a heat sink for cooling purposes (because the fuel was at a greater temperature than the component or the difference in temperature between the fuel and component was not great enough), can now use the fuel as a heat sink when embodiments of this disclosure are employed. For example, as electrical payload capability increases, often the heat load of these components (i.e., a heat source) increases, as well. Some heat management systems not employing embodiments of this disclosure, are unable to meet the heat rejection demands of such electrical payload components because the temperature difference needed between the payload component (i.e., a heat source) and the engine fuel, which is a common heat sink, cannot be met. However, heat management systems employing embodiments of this disclosure can increase a heat sink capacity per given temperature difference. In other words, embodiments allow warmer fuel to be employed for cooling components (e.g., electrical payload components or a FADEC). It is contemplated that embodiments may also employ heat sinks other than fuel.

Figure 3:
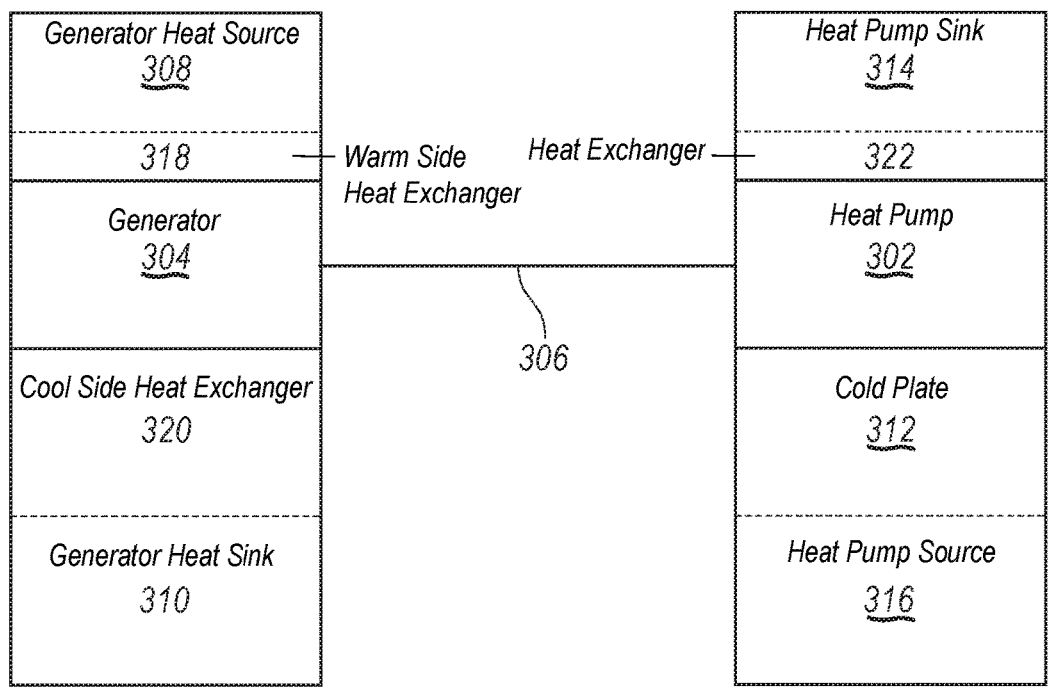
FIG. 3 illustrates a block diagram of an exemplary cooling system that is powered by a thermal generation system.

Referring to FIG. 3, a block diagram of an exemplary heat management system 300 is shown according to one embodiment. The heat management system 300 includes a heat pump 302 that is electrically coupled to a generator 304 via an electrical coupling 306. The generator 304 is employed to power the heat pump or cooler 302 via the electrical coupling 306 so that the heat pump 302 can initiate heat transfer between a heat source and a heat sink.

The heat management system 300 also includes a generator heat source 308, a generator heat sink 310 (shown in phantom), a solid thermal conductor or cold plate 312, a heat pump sink 314, and a heat pump source 316. According to embodiments, the heat pump source 316 may be at a lower temperature than the heat pump sink 314.

The heat pump 302 of the heat management system 300 can take on a variety of forms. For example, the heat pump 302 may be a TEC or a thermionic cooler. Similarly, the generator 304 may also take on a variety of forms. For example, the generator 304 may be a thermoelectric generator or a thermionic generator. Both generators convert heat to electrical energy.

In operation, the generator heat source 308 (e.g., warm fuel) and the generator heat sink 310 (e.g., an air stream), each being at different temperatures cause a thermal difference in the generator 304 such as a thermoelectric generator. This temperature difference drives the generation of electricity in the generator 304 (i.e., the thermoelectric generator in the present example).

It is contemplated that the generator heat source 308 may be coupled to the generator 304 via a warm side generator heat exchanger 318 (shown in partial phantom). Accordingly, the warm side generator heat exchanger 318 would serve as an intermediary, transferring the heat from the generator heat source 308 to the generator 304. Similarly, it is contemplated that a cool side heat exchanger 320 (shown in phantom) be employed to serve as an intermediary to transfer the heat away from the generator 304 to the generator heat sink 310.

Upon generation of the electricity in the generator 304, the electricity is passed via the electrical coupling 306 to the heat pump 302 (e.g., a TEC or thermionic cooler). Accordingly, the heat pump 302 is powered and drives the transfer of heat from the heat pump source 316 to the heat pump sink 314. In more detail, the heat from the heat pump source 316 is thermally conducted through the solid thermal conductor 312, passed through the heat pump 302, and transferred to the heat pump sink 314.

According to an alternate embodiment, the heat pump sink 314 is coupled to the heat pump 302 via a heat exchanger 322 (shown in partial phantom). In such an embodiment, the heat exchanger 322 is employed to transfer the heat from the heat pump 302 to the heat pump sink 314.

Figure 4:
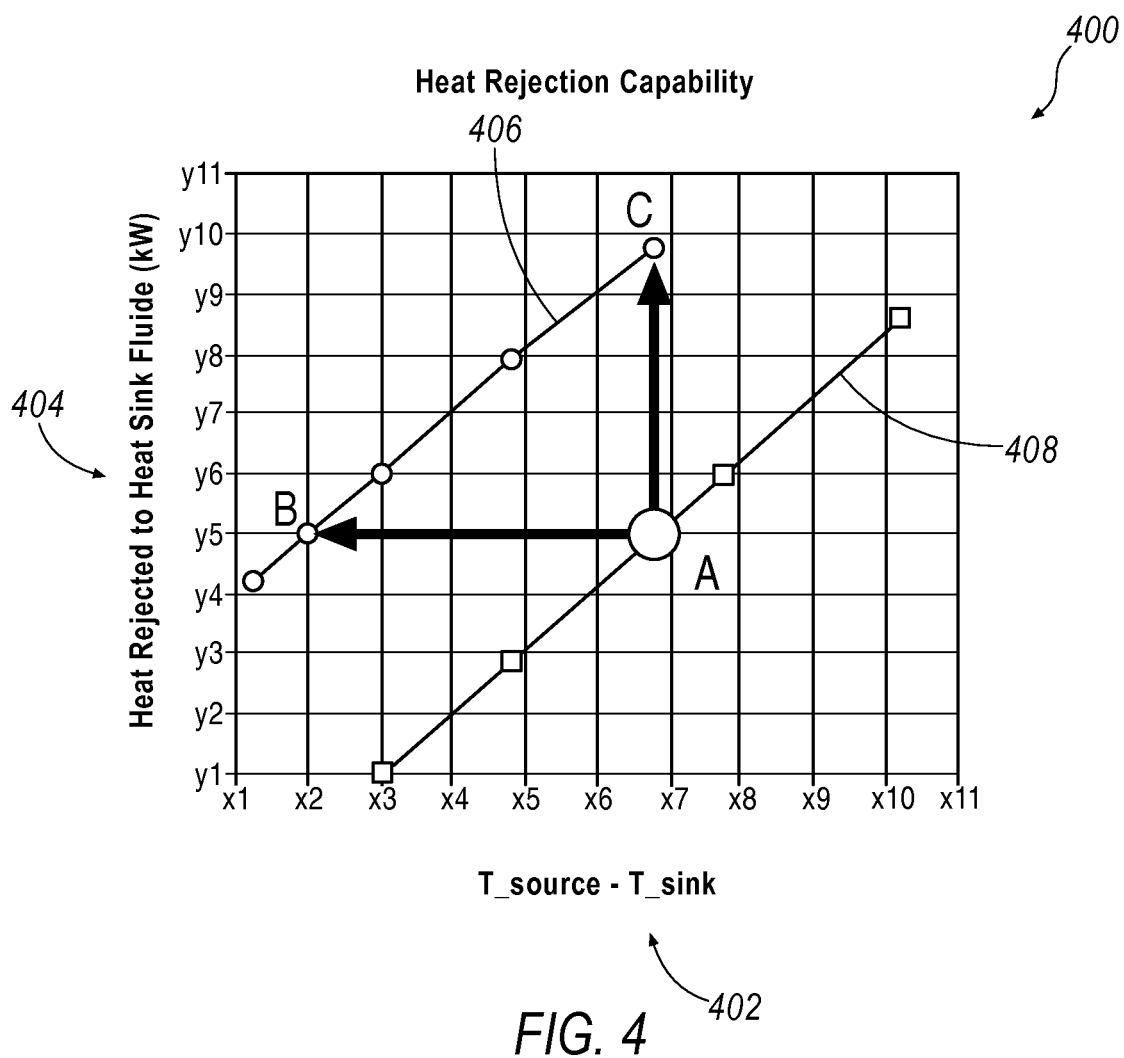
FIG. 4 illustrates exemplary heat rejection trends.

With reference now to FIG. 4, a graph 400 is shown depicting exemplary heat rejection trends. The graph 400 includes an x-axis 402 showing an increase in temperature difference between a heat source (T_source) and a heat sink (T_sink), increasing from temperature differences X1 to X11, and a y-axis 404 showing heat rejected to a heat sink in kilowatts (kW) increasing from corresponding heat transfer rates Y1 to Y11.

Also shown is an exemplary embodiment trend 406 and an exemplary reference trend 408. The exemplary embodiment trend 406 is a trend of a heat management system employing an embodiment with a heat pump or cooler. The exemplary reference trend 408 is a trend of a heat management system not employing an embodiment of the disclosure.

A comparison of the exemplary embodiment trend 406 with the exemplary reference trend 408 illustrates potential benefits of disclosed embodiments. For example, at point A on the exemplary reference trend 408, a temperature difference between a heat source and a heat sink of approximately X7 is shown. Further, the exemplary reference trend 408 illustrates that at this thermal difference (A) of approximately X7, only Y5 kW of heat is rejected to the heat sink. However, as illustrated by point B of the exemplary embodiment trend 406, a heat management system employing an embodiment of the disclosure can reject Y5 kW of heat to the sink with only a heat source/sink thermal difference of X2 (note: X2 can be negative). In other words, a heat management system following the exemplary embodiment trend 406 rejects the same amount of heat to a sink, but does so with less of a heat source/sink temperature difference than a heat management system following the exemplary reference trend 408 and having the same temperature difference.

An alternate way to view benefits of embodiments is with reference to point C on the exemplary embodiment trend 406. Point C illustrates that a heat management system employing an embodiment of the disclosure rejects Y10 kW of heat when the heat source/sink temperature difference is approximately X7. In contrast, a heat management system depicted with the exemplary reference trend 408 may only reject Y5 kW of heat at the same heat source/sink thermal difference (i.e., X7). It is noted once again that trends 406 and 408 are exemplary and are not intended to serve as standards.

It will be appreciated that the aforementioned method and devices may be modified to have some components and steps removed, or may have additional components and steps added, all of which are deemed to be within the spirit of the present disclosure. Even though the present disclosure has been described in detail with reference to specific embodiments, it will be appreciated that the various modifications and changes can be made to these embodiments without departing from the scope of the present disclosure as set forth in the claims. The specification and the drawings are to be regarded as an illustrative thought instead of merely restrictive thought.

What is claimed is:

1. A cooling assembly for a gas turbine engine comprising:
   a heat source at a first temperature;
   a solid heat sink at a second temperature;
   a heat pump coupled to the heat source and the solid heat sink, wherein the heat pump is configured to convey a quantity of heat from the heat source through the heat pump and to the solid heat sink;
   a thermoelectric generator electrically coupled to the heat pump, wherein the thermoelectric generator is configured to power the heat pump;
   wherein the thermoelectric generator is configured to have a first side coupled with a first fluid stream that is an air stream and a second side coupled with a second fluid stream that is a warm fuel stream, and wherein a temperature difference between the first fluid stream and the second fluid stream enables the thermoelectric generator to power the heat pump;
   wherein one of the heat source and the solid heat sink is directly mounted to one of a fan case and an inner fan casing of the gas turbine engine; and
   wherein the thermoelectric generator is mounted to an inner surface of the inner fan casing, a surface cooler heat exchanger is coupled to the thermoelectric generator and mounted to an outer surface of the inner fan casing, and the first fluid stream is a bypass air stream passing over the inner fan casing through or past the surface cooler heat exchanger such that heat is conveyed to the first fluid stream.

2. The cooling assembly of claim 1, wherein the solid heat sink is configured to allow a fuel to pass therethrough, and wherein the second temperature is greater than the first temperature.

3. The cooling assembly of claim 1, wherein the heat source is one of a full authority digital engine control (FADEC) and a heat exchanger having a material passing therethrough.

4. The cooling assembly of claim 3, wherein the material is a heat transfer fluid.

5. The cooling assembly of claim 1, wherein the heat pump is one of a thermionic cooler and a thermoelectric cooler.

6. A heat transfer system for a gas turbine engine comprising:
   a surface cooler heat exchanger;
   a generator;
   a heat exchanger heat source coupled to the generator, wherein the heat exchanger heat source is configured to remove heat from a warm fuel stream passing therethrough, and wherein the generator is configured to cause a quantity of heat to pass from the heat exchanger heat source through the generator and to the surface cooler heat exchanger, and wherein a temperature difference between the heat exchanger heat source and the surface cooler heat exchanger enables the generator to generate electricity;
   wherein the generator is mounted to an inner surface of an inner fan casing of the gas turbine engine, and the surface cooler heat exchanger is mounted to an outer surface of the inner fan casing such that heat conveys from the surface cooler heat exchanger to a bypass air stream passing over the inner fan casing through or past the surface cooler heat exchanger;
   a heat sink mounted on one of a fan case or the inner fan casing of the gas turbine engine;
   a heat pump coupled to the heat sink, the heat pump being powered by the generator; and
   a full authority digital engine control (FADEC) in contact with the heat pump, wherein the heat pump is configured to convey a quantity of heat from the FADEC to the heat sink.

7. The heat transfer system for a gas turbine engine of claim 6, wherein the heat sink is a cold plate with a fluid.

8. The heat transfer system of claim 6, wherein the heat pump is one of a thermionic chip or a thermoelectric cooler.

9. A method of conveying heat in a gas turbine engine comprising:
   coupling a heat pump on a first side thereof to an inner surface of an inner fan casing of the gas turbine engine;
   coupling a second side of the heat pump to a heat source, wherein the first side of the heat pump is opposite the second side of the heat pump;
   mounting a heat sink to an outer surface of the inner fan casing of the gas turbine engine;
   electrically coupling a thermoelectric generator to the heat pump to power the heat pump;
   mounting the thermoelectric generator to the inner surface of the inner fan casing;
   coupling a surface cooler heat exchanger to the thermoelectric generator, and mounting the surface cooler heat exchanger to the outer surface of the inner fan casing, such a first side of the thermoelectric generator is thermally coupled to a bypass air stream passing over the inner fan casing through or past the surface cooler heat exchanger;
   coupling a second side of the thermoelectric generator to a warm fuel stream, such that heat is conveyed through the thermoelectric generator from the warm fuel stream to the bypass air stream;
   generating power with the thermoelectric generator by using a temperature difference between the bypass air stream and the warm fuel stream;
   powering the heat pump using the thermoelectric generator so that the heat pump causes a quantity of heat to pass from the heat source to the heat sink; and
   conveying heat from the heat sink to the bypass air stream passing over the inner fan casing through or past the heat sink.

10. The method of claim 9, wherein the heat source is at a temperature different than the heat sink.

11. The method of claim 9, wherein the heat source is a heat exchanger.

12. The method of claim 11, further comprising passing a fluid through the heat exchanger.

* * * * *